United States Patent
Jeong et al.

(10) Patent No.: US 9,107,319 B2
(45) Date of Patent: Aug. 11, 2015

(54) DC LINK CAPACITOR ASSEMBLY

(71) Applicant: LSIS CO., LTD., Anyang-si, Gyeonggi-do (KR)

(72) Inventors: Han Uk Jeong, Cheonan-si (KR); Ung Hoe Kim, Incheon-si (KR); Hyoung Taek Kim, Daejeon-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 117 days.

(21) Appl. No.: 14/074,482

(22) Filed: Nov. 7, 2013

(65) Prior Publication Data

US 2014/0168869 A1   Jun. 19, 2014

(30) Foreign Application Priority Data

Dec. 17, 2012   (KR) .................. 10-2012-0147938

(51) Int. Cl.
| | | |
|---|---|---|
| *H05K 7/14* | (2006.01) | |
| *H01G 4/224* | (2006.01) | |
| *H01G 4/38* | (2006.01) | |

(52) U.S. Cl.
CPC ............. *H05K 7/1432* (2013.01); *H01G 4/224* (2013.01); *H01G 4/38* (2013.01)

(58) Field of Classification Search
CPC ..... H05K 7/1432; H05K 13/00; H02M 7/003; H02M 1/44; H01L 27/0805; H01L 28/40; H01G 4/38; H01G 4/232; H01G 4/30; H01G 9/08; H01G 4/224; H01G 2/10; H01G 5/014

USPC ................ 361/689, 699, 600, 624, 631, 818; 318/445, 400.27, 400.01; 363/141
See application file for complete search history.

(56) References Cited

U.S. PATENT DOCUMENTS

| | | | |
|---|---|---|---|
| 3,870,392 A | | 3/1975 | Bond |
| 5,548,473 A | * | 8/1996 | Wang .......................... 361/301.1 |
| 8,670,223 B2 | * | 3/2014 | Imamura et al. ............... 361/329 |
| 8,878,483 B2 | * | 11/2014 | Darroman et al. ............. 320/107 |
| 2003/0200761 A1 | * | 10/2003 | Funahashi et al. ............ 62/228.4 |
| 2007/0253164 A1 | * | 11/2007 | Matsuo et al. ................. 361/699 |

(Continued)

FOREIGN PATENT DOCUMENTS

| | | |
|---|---|---|
| JP | 2012-249453 | 12/2012 |
| JP | 2012-249480 | 12/2012 |
| WO | 2010/067514 | 6/2010 |

OTHER PUBLICATIONS

Japan Patent Office Application Serial No. 2013-235788, Office Action dated Nov. 4, 2014, 2 pages.

*Primary Examiner* — Adrian S Wilson
*Assistant Examiner* — Abhishek Rathod
(74) *Attorney, Agent, or Firm* — Lee, Hong, Degerman, Kang & Waimey (57) ABSTRACT

A DC link capacitor assembly is provided. The DC link capacitor assembly according to the embodiment includes a DC link capacitor disposed in a housing. The housing includes a top surface, a bottom surface disposed spaced downward from the top surface, at least one side surface connecting the top surface to the bottom surface, an opening defined at a front side between the top surface and the bottom surface and an external capacitor accommodation part disposed outside the side surface.

7 Claims, 5 Drawing Sheets

(56) References Cited

U.S. PATENT DOCUMENTS

| | | | |
|---|---|---|---|
| 2008/0164831 A1* | 7/2008 | Miller et al. | 318/445 |
| 2009/0218129 A1* | 9/2009 | Taniguchi et al. | 174/503 |
| 2009/0237905 A1* | 9/2009 | Motoda | 361/784 |
| 2010/0321889 A1* | 12/2010 | Yoshino et al. | 361/702 |
| 2012/0206950 A1* | 8/2012 | Duppong et al. | 363/141 |
| 2013/0113074 A1* | 5/2013 | Ebersberger et al. | 257/532 |
| 2014/0029319 A1* | 1/2014 | Jochman | 363/67 |
| 2014/0321090 A1* | 10/2014 | Guerin et al. | 361/782 |

* cited by examiner

"PRIOR ART"

DC LINK CAPACITOR ASSEMBLY

CROSS-REFERENCE TO RELATED APPLICATIONS

Pursuant to 35 U.S.C. §119(a), this application claims the benefit of earlier filing date and right of priority to Korean Application No. 10-2012-0147938, filed on Dec. 17, 2012, the contents of which is incorporated by reference herein in its entirety.

BACKGROUND

The present disclosure relates to a DC link capacitor assembly that is included in a power conversion device.

DC link capacitor assemblies are used for absorbing or blocking an overvoltage, a surge voltage, a noise voltage which are introduced from a DC or AC power source of an input terminal in a power conversion (inverter and converter) device for an electric vehicle, and a surge voltage and a noise voltage which are generated from by the swing of a semiconductor for internal power a product.

Such a DC link capacitor assembly is provided with a DC link capacitor, an X-capacitor, and a Y-capacitor, which are separately manufactured and coupled to each other, in a housing.

Figure 1:
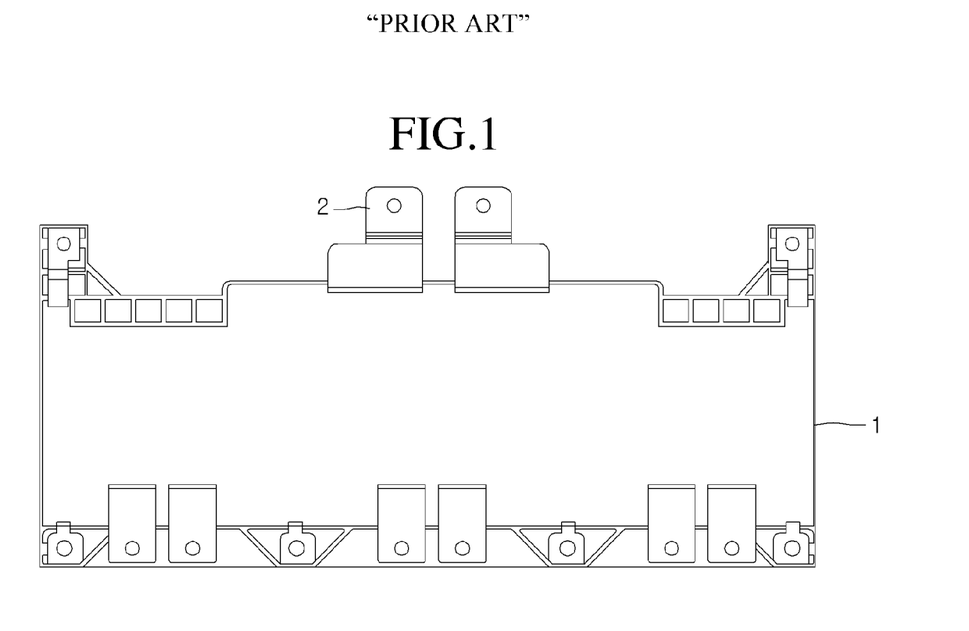
FIG. 1 a bottom view of a DC link capacitor assembly according to a related art.

FIG. 1 a bottom view of a DC link capacitor assembly according to a related art.

In the DC link capacitor assembly of FIG. 1 according to the related art, a housing 1 has an opened bottom surface. Thus, a DC link capacitor, an X-capacitor, and a Y-capacitor are inserted into the housing 1 through the lower opening of the housing 1, and then resin or silicon is poured into the opening to seal the opening, thereby manufacturing the DC link capacitor assembly.

In this case, since the assembling process is complicated, manufacturing costs may increase, the total size of the housing relatively increases. Thus, it may difficult to expect the efficiency in terms of space application.

Also, since a PCB or switching module is disposed under a bottom sealing part of a housing having relatively high heat-transfer efficiency, heat generated from the DC link capacitor assembly is excessively transferred into the switching module or the controlling PCB to deteriorate temperature characteristics of a product.

Also, as shown in FIG. 1, since a terminal 2 of a bus bar protrudes to the outside through the opened bottom surface of the housing, and the protruding terminal 2 of the bus bar has to be located at the shortest distance with respect to a power switching module (not shown), the switching module or the PCB have to be parallely disposed under the bottom surface of the housing 1 that is sealed by using the silicon. Thus, it may be inefficient in space application.

SUMMARY

Embodiments provide a DC link capacitor assembly that is easy in coupling, efficient in space application, and superior in temperature characteristic.

In one embodiment, a DC link capacitor assembly includes: a DC link capacitor disposed within a housing, wherein the housing includes: a top surface; a bottom surface disposed spaced downward from the top surface; at least one side surface connecting the top surface to the bottom surface; an opening defined at a front side between the top surface and the bottom surface; and an external capacitor accommodation part disposed outside the side surface.

The DC link capacitor assembly may further include a through-hole defined in the side surface disposed on a side opposite to the opening.

The external capacitor accommodation part may have an opened lower side.

The external capacitor accommodation part may be provided in at least two, and the at least two external capacitor accommodation parts may be spaced apart from each other, wherein the through-hole may be defined between the two external capacitor accommodation parts.

The DC link capacitor may include: a plurality of capacitor cells; a first bus bar connected to one ends of the plurality of capacitor cells in common; a first terminal of the first bus bar protruding and extending backward from the first bus bar; a second bus bar connected to the other ends of the plurality of capacitor cells in common; and a first terminal of the second bus bar protruding and extending backward from the second bus bar, wherein the first terminal of the first bus bar and the first terminal of the second bus bar may pass through the through-hole to protrude backward from the housing.

The DC link capacitor assembly may further include an external Y-CAP accommodated in the external capacitor accommodation part, wherein the external Y-CAP may include: a capacitor cell; a first terminal of the external Y-CAP coupled to one end of the capacitor cell; and a second terminal of the external Y-CAP coupled to the other end of the capacitor cell, wherein the first terminal of the external Y-CAP may contact one of the first terminal of the first bus bar or the first terminal of the second bus bar, and the second terminal of the external Y-CAP may be grounded.

The DC link capacitor assembly may further include: an internal X-CAP disposed inside the housing, the internal X-CAP being coupled to a front side of the DC link capacitor; and an internal Y-CAP disposed inside the housing, the internal Y-CAP being coupled to the front side of the DC link capacitor.

The internal X-CAP may include: a plurality of capacitor cells disposed parallel to each other; a third bus bar connected to one ends of the plurality of capacitor cells in common; and a first terminal of the third bus bar protruding and extending forward from the third bus bar, wherein the first terminal of the third bus bar may contact the second terminal of the second bus bar extending forward from the second bus bar.

The internal Y-CAP may include: a plurality of capacitor cells disposed parallel to each other; a fourth bus bar connected to one ends of the plurality of capacitor cells in common; and a first terminal of the fourth bus bar protruding and extending from the fourth bus bar, wherein the first terminal of the fourth bus bar may be grounded.

DETAILED DESCRIPTION OF THE EMBODIMENTS

Hereinafter, constitutions of a DC link capacitor assembly according to an embodiment will be described with reference to the accompanying drawings.

Although a DC link capacitor assembly provided in a power conversion device for a vehicle is exemplified in the following description, the present disclosure is not limited thereto. For example, the DC link capacitor assembly according to an embodiment may be applied to power conversion devices for home and industries.

In the constitutions of the DC link capacitor according to the embodiment, a front side represents a side in which an opening 130 is defined, and a rare side represents a side opposite to the opening 130, i.e., a side in which a through-hole 120 is defined with respect to a housing 100.

Figure 2:
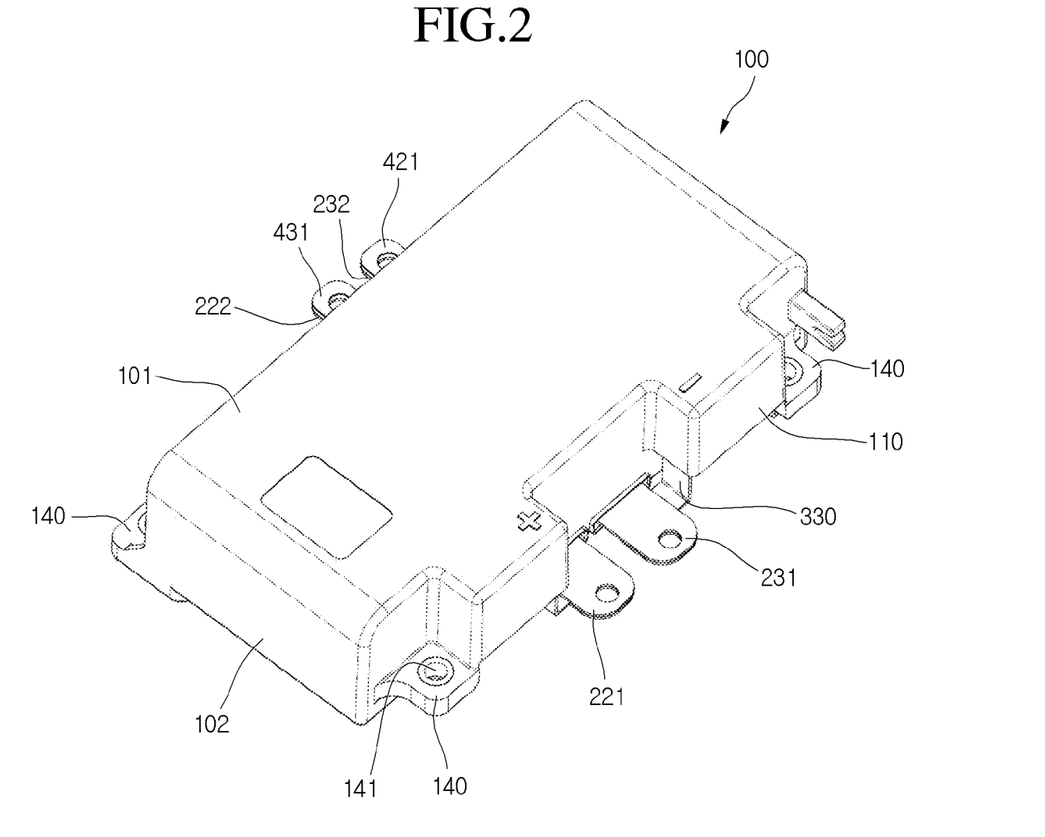
FIG. 2 is a perspective view of a DC link capacitor assembly according to an embodiment.
Figure 3:
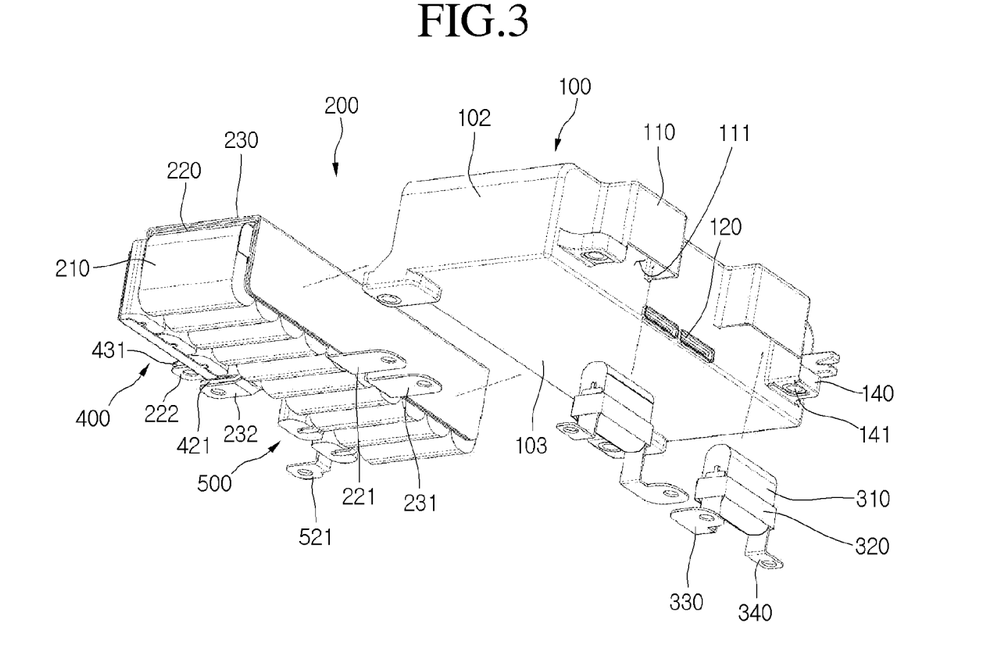
FIG. 3 is an exploded perspective view of the DC link capacitor assembly according to the embodiment.
Figure 4:
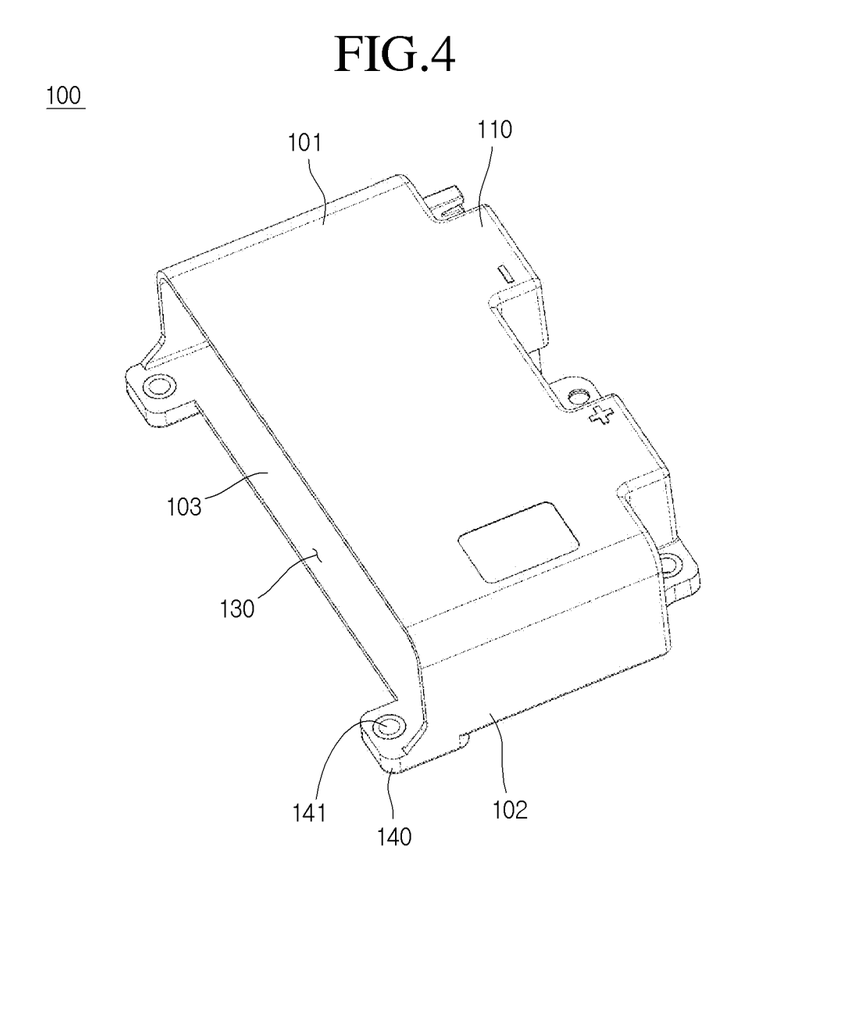
FIG. 4 is a perspective view illustrating a housing of the DC link capacitor assembly according to the embodiment.
Figure 5:
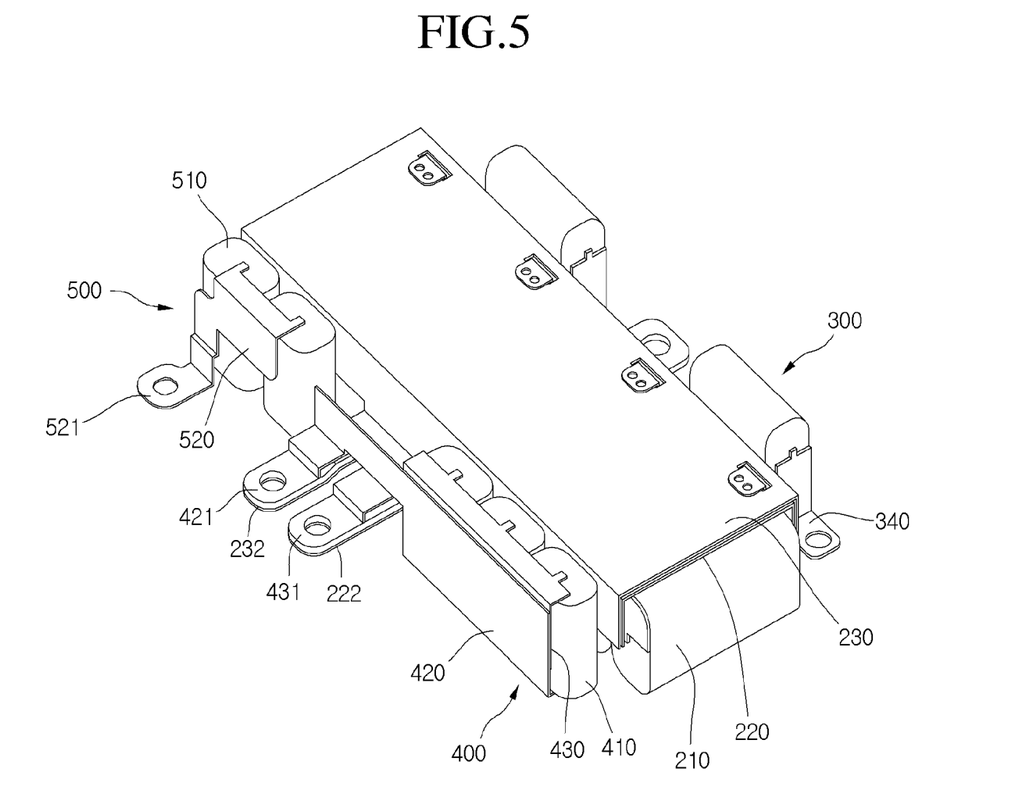
FIG. 5 is a perspective view of the DC link capacitor assembly except for the housing according to the embodiment.

FIG. 2 is a perspective view of the DC link capacitor assembly according to the embodiment. FIG. 3 is an exploded perspective view of the DC link capacitor assembly according to the embodiment. FIG. 4 is a perspective view illustrating a housing of the DC link capacitor assembly according to the embodiment. FIG. 5 is a perspective view illustrating the DC link capacitor assembly except for the housing according to the embodiment.

The DC link capacitor assembly according to the embodiment may include the housing 100, a DC link capacitor 200 coupled to the housing 100, an internal X-capacitor 400 (hereinafter, referred to as an "internal X-CAP"), an internal Y-capacitor 500 (hereinafter, referred to as an "internal Y-CAP"), and an external Y-capacitor 300 (hereinafter, referred to as an "external Y-CAP").

Referring to FIG. 4, in constitutions of the housing 100, the housing 100 has an approximately polyhedral shape with the opening 130 defined in one side surface thereof. Thus, the housing 100 may include a top surface 101, side surfaces 102 each extending downward from an edge of the top surface 101, a bottom surface 103 connecting lower ends of the side surfaces 102 to each other to extend approximately parallel to the top surface 101. The bottom surface 103 is disposed spaced downward from the top surface 101 and extends approximately parallel to the top surface 101.

Here, each of the top and bottom surfaces 101 and 103 has a plate-shaped member having an approximately square shape, and the side surfaces 102 are provided in three. Also, the opening 130 is defined in a side on which the side surfaces 102 are not disposed. That is, the opening 103 is defined in the front side of the housing 100. The three side surfaces 102 are disposed on both left and right sides and the rear side of the opening 130. Since the three side surfaces 102 are rounded to extend from each other, a boundary therebetween may be unclear.

However, the number of side surfaces 102 may be variously selected according to a shape of the housing.

In the housing 100, a space defined by the top surface 101, the side surfaces 102, and the bottom surface 103 is defined as a DC link capacitor accommodation part to accommodate the DC link capacitor 200, the internal X-CAP, and the internal Y-CAP which will be described later.

An external capacitor accommodation part 110 is defined outside the side surface facing the opening 130. The external capacitor accommodation part 110 is provided in two. Here, the two external capacitor accommodation parts 110 are horizontally symmetrical to each other. Also, an opening (see reference numeral 111 of FIG. 3) is defined in a lower portion of each of the external capacitor accommodation parts 110. In more detail, the external capacitor accommodation part 110 may have an approximately rectangular plane section corresponding to a shape of a capacitor cell 310 to be described later. Also, an upper end of the external capacitor accommodation part 110 is covered, and a lower end is opened.

Thus, an external Y-CAP 300 to be described later is inserted upward from a lower side of the external capacitor accommodation part 110 through the opening 111 and then is coupled to the external capacitor accommodation part 110.

The through-hole 120 is defined between the two external capacitor accommodation parts 110. Thus, the through-hole 120 forwardly backwardly passes through the side surface 102 opposite to that in which the opening 130 is defined.

The through-hole 120 lengthily extends in left and right directions so that a first terminal 221 of a first bus bar 220 and a first terminal 231 of a second bus bar 230 pass therethrough. Also, the through-hole 120 may have a shape approximately corresponding to that of each of the terminals 221 and 231.

An installation part 140 is disposed on each of edges of the housing 100. The installation part 140 may have an installation hole 141 vertically passing through a center thereof.

Referring to FIGS. 3 and 5, constitutions of the DC link capacitor 200 will be described.

The DC link capacitor 200 may include a plurality of capacitor cells 210 disposed parallel to each other, the first bus bar 220 connected to one sides of the plurality of capacitor cells 210 in common, and the second bus bar 230 connected to the other sides of plurality of capacitor cells 210 in common.

When viewed from a side, the first and second bus bars 220 and 230 may have an approximately "⌐" shape facing a lower side, and terminals of the first and second bus bars 220 and 230 protrude and extend from front and rear ends thereof toward the outside.

In more detail, the first bus bar 220 includes a horizontally extending portion and a portion vertically extending on each of front and rear ends of the horizontally extending portion. Also, the first bus bar 220 includes the first terminal 221 extending backward from a lower end of the vertically extending portion which is disposed on a rare side and a second terminal 222 extending forward from a lower end of the vertically extending portion which is disposed on a front side.

Also, the second bus bar 230 includes a horizontally extending portion and a portion vertically extending from each of front and rear ends of the horizontally extending portion. Also, the second bus bar 230 includes the first terminal 231 extending backward from a lower end of the vertically extending portion which is disposed on a rare side and a second terminal 232 extending forward from a lower end of the vertically extending portion which is disposed on a front side.

The first bus bar 220 may be disposed spaced apart from the second bus bar 230. A member for insulation may be disposed between the first and second bus bars 220 and 230. The second bus bar 230 may be disposed above the first bus bar 220.

The internal X-CAP 400 and the internal Y-CAP 500 are disposed at the front side of the DC link capacitor 200.

The internal X-CAP 400 includes a plurality of capacitor cells 410 disposed parallel to each other, a third bus bar 420 connected to one ends of the plurality of capacitor cells 410 in common, and a fourth bus bar 430 connected to the other ends of the plurality of capacitor cells 410 in common.

The third bus bar 420 includes a first terminal 421 protruding forward, and a fourth bus bar 440 includes a first terminal 431 protruding forward.

Thus, the first terminal 421 of the third bus bar 420 contacts the second terminal 232 of the second bus bar 230 at the front side of the DC link capacitor 200. Also, the first terminal 431 of the fourth bus bar 440 contacts the second terminal 222 of the first bus bar 220.

The internal Y-CAP 500 includes a plurality of capacitor cells 510 disposed parallel to each other and a fifth bus bar 520 connected to one ends of the plurality of capacitor cells 510 in common. The fifth bus bar 520 includes a first terminal 521 protruding forward, and the first terminal 521 of the fifth bus bar 520 is grounded.

Hereinafter, constitutions of the external Y-CAP 300 accommodated in the external capacitor accommodation part 110 will be described with reference to FIG. 3.

The external Y-CAP 300 includes the capacitor cell 310, a terminal fixing part 320 surrounding the outside of the capacitor cell 310, a first terminal 330 fixed and coupled to one end of the capacitor cell 310 by the terminal fixing portion 320, and a second terminal 340 fixed and coupled to the other end of the capacitor cell 310 by the terminal fixing portion 320.

The external Y-CAP 300 is provided in two which are symmetrical to each other in a horizontal direction.

One first terminal 330 of the two external Y-CAPS 300 is in contact with the first terminal 221 of the first bus bar 220, and the other first terminal 330 of the two external Y-CAPS 300 is in contact with the first terminal 231 of the second bus bar 230.

The second terminal 340 of each of the external Y-CAPS 300 may be connected to the ground.

With the above constitutions, a positive voltage is applied to the first terminal 221 of the first bus bar 220, and a negative voltage is applied to the first terminal 231 of the second bus bar 230.

Also, a positive voltage is output from the second terminal 222 of the first bus bar 220 and the first terminal 431 of the fourth bus bar 430. A negative voltage is output from the second terminal 232 of the second bus bar 230 and the first terminal 421 of the third bus bar 420.

The output terminal may be an input terminal of an insulated gate bipolar transistor (IGBT).

Hereinafter, a process in which the DC link capacitor 200 including the above-described constitutions, the internal X-CAP 400, and the internal Y-CAP 500 are coupled to the DC link capacitor accommodation part within the housing 100 and a process in which the external Y-CAP 300 is coupled to the external capacitor accommodation part 110 will be described with reference to FIG. 3.

First, the DC link capacitor 200, the internal X-CAP 400, and the internal Y-CAP 500 are coupled with the above-described structure and then are pushed and inserted into an inner space through the opening 130 of the side surface of the housing 100.

When the DC link capacitor 200, the internal X-CAP 400, and the internal Y-CAP 500 are slid and inserted backward through the front opening 130, the first terminal 221 of the first bus bar 220 and the first terminal 231 of the second bus bar 230 are pushed backward through the through-hole 120 defined in the rare side of the housing 100.

In this state, a resin or silicon is applied to the front side of the opening 130 to seal a gap of the opening 130.

Next, the external Y-CAP 300 is pushed and inserted upward from a lower side of the external capacitor accommodation part 110 through the opening 111 defined in the lower end of the external capacitor accommodation part 110.

When the external Y-CAP 300 is coupled to the external capacitor accommodation part 110, the first terminals 330 of the two external Y-CAPS 300 respectively contact the first terminal 221 of the first bus bar 220 and the first terminal 231 of the second bus bar 230, and the second terminal 340 of the external Y-CAP 300 is connected to the ground.

Thus, the external Y-CAP 300 may be easily connected to DC link capacitor 200.

Also, since the first terminal 221 of the first bus bar 220 and the first terminal 231 of the second bus bar 230 pass through the through-hole 120 to protrude, the constitution such as the IGBT may be disposed on the side surface to improve space application efficiency.

According to the embodiment, the DC link capacitor assembly may be easily assembled.

Since the power switching module or the controlling PCB that is connected to the DC link capacitor assembly is disposed on the side surface of the DC link capacitor assembly, the space may be efficiently utilized.

Since the DC link capacitor assembly, the internal X-CAP, and the internal Y-CAP may be coupled to each other and provided in one assembly form, storage and inventory management of components may be easy.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A DC link capacitor assembly comprising:
a DC link capacitor disposed within a housing,
wherein the housing comprises:
a top surface;
a bottom surface disposed spaced downward from the top surface;
at least one side surface connecting the top surface to the bottom surface;
an opening defined at a front side between the top surface and the bottom surface;
an external capacitor accommodation part disposed outside the at least one side surface; and
a through-hole defined in the at least one side surface disposed on a side opposite to the opening,
wherein:
the external capacitor accommodation part comprises at least two external capacitor accommodation parts that are spaced apart from each other; and
the through-hole is defined between the two external capacitor accommodation parts.

2. The DC link capacitor assembly according to claim 1, wherein the external capacitor accommodation part has an opened lower side.

3. The DC link capacitor assembly according to claim 1, wherein the DC link capacitor comprises:
a plurality of capacitor cells;
a first bus bar connected to one ends of the plurality of capacitor cells in common;
a first terminal of the first bus bar protruding and extending backward from the first bus bar;
a second bus bar connected to the other ends of the plurality of capacitor cells in common; and
a first terminal of the second bus bar protruding and extending backward from the second bus bar, wherein the first terminal of the first bus bar and the first terminal of the second bus bar pass through the through-hole to protrude backward from the housing.

4. The DC link capacitor assembly according to claim 3, further comprising an external Y-CAP accommodated in the external capacitor accommodation part,
   wherein the external Y-CAP comprises:
   a capacitor cell;
   a first terminal of the external Y-CAP coupled to one end of the capacitor cell; and
   a second terminal of the external Y-CAP coupled to the other end of the capacitor cell,
   wherein the first terminal of the external Y-CAP contacts one of the first terminal of the first bus bar or the first terminal of the second bus bar, and
   the second terminal of the external Y-CAP is grounded.

5. The DC link capacitor assembly according to claim 1, further comprising:
   an internal X-CAP disposed inside the housing, the internal X-CAP being coupled to a front side of the DC link capacitor; and
   an internal Y-CAP disposed inside the housing, the internal Y-CAP being coupled to the front side of the DC link capacitor.

6. The DC link capacitor assembly according to claim 5, wherein the internal X-CAP comprises:
   a plurality of capacitor cells disposed parallel to each other;
   a third bus bar connected to one ends of the plurality of capacitor cells in common; and
   a first terminal of the third bus bar protruding and extending forward from the third bus bar,
   wherein the first terminal of the third bus bar contacts a second terminal of a second bus bar extending forward from the second bus bar.

7. The DC link capacitor assembly according to claim 5, wherein the internal Y-CAP comprises:
   a plurality of capacitor cells disposed parallel to each other;
   a fifth bus bar connected to one ends of the plurality of capacitor cells in common; and
   a first terminal of the fifth bus bar protruding and extending from the fifth bus bar,
   wherein the first terminal of the fifth bus bar is grounded.

* * * * *